(12) United States Patent
Roy

(10) Patent No.: US 10,535,693 B2
(45) Date of Patent: Jan. 14, 2020

(54) INFRA-RED RESPONSE ENHANCEMENT FOR IMAGE SENSOR

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/916,912

(22) Filed: Mar. 9, 2018

(65) Prior Publication Data

US 2019/0280024 A1    Sep. 12, 2019

(51) Int. Cl.
*H01L 27/146*    (2006.01)

(52) U.S. Cl.
CPC ...... *H01L 27/1463* (2013.01); *H01L 27/1464* (2013.01); *H01L 27/14649* (2013.01); *H01L 27/14689* (2013.01)

(58) Field of Classification Search
CPC ............. H01L 27/1463; H01L 27/1464; H01L 27/14649
See application file for complete search history.

(56) References Cited

U.S. PATENT DOCUMENTS

| 8,513,761 B2 | 8/2013 | Roy et al. |
| 2014/0291481 A1* | 10/2014 | Zhang ................ H04N 5/361 250/208.1 |
| 2015/0053923 A1 | 2/2015 | Frey et al. |
| 2015/0340391 A1 | 11/2015 | Webster |
| 2019/0237499 A1* | 8/2019 | Roy ................ H01L 27/14614 |

* cited by examiner

*Primary Examiner* — Errol V Fernandes
(74) *Attorney, Agent, or Firm* — Crowe & Dunlevy

(57) ABSTRACT

A semiconductor body of a first conductivity type and doped with a first doping level includes, at a front side surface thereof, a well of a second conductivity type and a region doped with the first conductivity type at a second doping level greater than the first doping level. An insulated vertical gate structure separates the region from the well. Buried iInsulated electrodes extend from the front side surface completely through the well and into a portion of the semiconductor body underneath the well. A conductive material portion of each buried insulated electrode is configured to receive a bias voltage and a conductive material portion of insulated vertical gate structure is configured to receive a gate voltage. The semiconductor body is delimited by a capacitive deep trench isolation that is biased at the same voltage as the buried insulated electrode.

27 Claims, 4 Drawing Sheets

INFRA-RED RESPONSE ENHANCEMENT FOR IMAGE SENSOR

TECHNICAL FIELD

The present disclosure relates to an image sensor and, in particular, to an enhancement of the response of the image sensor to infra-red radiation.

BACKGROUND

Reference is made to FIG. 1 showing a cross-section view of an embodiment of a cell 10 of an image sensor as taught by U.S. Pat. No. 8,513,761 (incorporated by reference). This cell 10 is manufactured from a portion of a semiconductor layer (or body) 12 that is lightly-doped with a first conductivity type dopant. The semiconductor material for layer 12 may, for example, comprise silicon. The dopant concentration within layer 12 may, for example, be on the order of from $10^{14}$ to $10^{16}$ atoms/cm$^3$. The layer 12 has a thickness smaller than 20 preferably on the order of from 2 to 6 μm and may, for example, have been formed as the upper silicon layer of a structure of silicon on insulator type (SOI). A wall 14 surrounds the cell 10 and separates the cell 10 from neighboring cells in the image sensor (with a pitch, for example, for adjacent cells of 2 μm). The wall 14 comprises a capacitive deep trench isolation (CDTI) type structure that is formed by a trench 16 having an insulating liner 18 (such as formed by a thermal oxide) and filled with a conductive or semiconductive material (such as a polysilicon material) 20. The trench 16 extends completely through the thickness of the layer 12. The material 20 is electrically connected to be biased with a voltage Vwall. A width of the wall 14 may, for example, be 0.2-0.4 μm. The width of the cell 10 may, for example, be on the order of about 2 μm.

At a front side of the layer 12, a ring shaped well 22 heavily-doped with a second conductivity type dopant extends into the layer 12. The dopant concentration within well 22 may, for example, be on the order of from $1 \times 10^{16}$ to $1 \times 10^{18}$ atoms/cm$^3$. A lateral width of ring well may, for example, be 0.5-0.6 μm. The ring shaped well 22 surrounds a central first conductivity type region of the layer 12 at the front side. The central first conductivity type region includes a portion 24 of the lightly-doped layer 12 and a top region 26 heavily-doped with the first conductivity type dopant and extending into the layer 12 on top of and in contact with the portion 24. The dopant concentration within top region 26 may, for example, be on the order of from $1 \times 10^{19}$ to $5 \times 10^{20}$ atoms/cm$^3$. A lateral width of the central first conductivity type top region 26 may, for example, be 0.2-0.6 μm.

The central first conductivity type top region 26 is separated from the ring shaped well 22 by a wall 30. A width of the wall 30 may, for example, be 0.1-0.4 μm. The wall 30 comprises a vertical gate (VEGA) electrode type structure that is formed by a trench 32 having an insulating liner 34 (such as formed by a thermal oxide) and filled with a semiconductive material (such as a polysilicon material) 36. The trench 32 extends to a depth that exceeds the thickness of the ring shaped well 22 (but does not extend completely through the layer 12). The material 36 is electrically connected to be biased with a voltage Vgate. The portion 24, top region 26 and VEGA electrode form a transfer gate transistor (TG) for the cell 10. The ring shaped well 22 supports the formation of a number of other transistors of the planar MOSFET type for the cell 10. These transistors include a reset (precharge) transistor (RST) and a source-follower transistor (SF). The connection and operation of the transistors TG, RST and SF are well known to those skilled in the art with respect to the operation of the cell 10. A read transistor for the cell 10 is not shown in FIG. 1 but is connected to the circuitry in a manner known to those skilled in the art to support signal read out operations. In general, various metallization levels are formed on the front side to ensure the electrical connections to and between the drains, sources, and gates of the various transistors. In particular, an interconnect corresponding to a read node S of the cell is provided between top region 26, the drain of reset transistor RST, and the gate of the source-follower transistor SF is supported by the various metallization levels. The precharge and read transistors may be common to several neighboring cells (for example, shared by a group of four cells).

The cell 10 is a backside illumination (BSI) device. At a back side of the layer 12, a thin layer 40 heavily-doped of the second conductivity type is formed extending into the layer 12 from the rear surface. The dopant concentration within layer 40 may, for example, be on the order of from $1 \times 10^{17}$ to $1 \times 10^{19}$ atoms/cm$^3$. The layer 40 has a function of inversion of the type of majority carriers contained in layer 12. This inversion of the concentration of the type of carriers might also be performed by a MOS capacitance at the rear surface provided with an electrode (metallic, semiconductor, or dielectric), transparent in the useful sensor sensitivity spectrum, which creates a free carrier inversion channel (MOS effect).

The rear surface of each cell is covered with an antireflection coating layer 42 and a filter layer 44 having the desired color for the considered cell, for example, red, green, blue or infra-red. Although this is optional in this type of structure, a lens 48 may cover filter layer 44.

Operation of the cell for light detection is well known in the art. There is a phase of photoconversion or integration during which the rear surface is illuminated and electrons are stored in a charge collection area of layer 12. A transfer phase then occurs during which the electrons are transferred from a charge collection area of layer 12 to the top region 26 working as the read node S. During the integration phase, the conduction between the charge collection area of layer 12 and top region 26 is interrupted by the transfer gate transistor (TG) in response to application of the gate voltage Vgate to the conductor 36 of the vertical gate electrode. When the vertical gate electrode is biased at a low or negative voltage, for example, −1 volt, the portion 24 of the lightly-doped layer 12 is fully depleted from electrons and the passing of the charge carriers is inhibited by the potential barrier (inversion layer) thus created between portion 24 and the charge collection area of layer 12. Thus, the portion 24 plays the role of a controlled channel region and top region 26 corresponds to a drain region of the transfer gate transistor connected to the read node S.

SUMMARY

In an embodiment, an image sensor cell comprises: a semiconductor body of a first conductivity type delimited by an insulating peripheral wall and doped with a first doping level; at a front side surface of the semiconductor body, a ring-shaped well of a second conductivity type; at the front side surface of the semiconductor body, a region doped with the first conductivity type at a second doping level greater than the first doping level, said region surrounded by the ring-shaped well; an insulated vertical gate structure within the semiconductor body and separating said region from the ring-shaped well, wherein a conductive material portion of the insulated vertical gate structure is configured to receive a gate voltage; and a plurality of deep trench isolation rings extending from the front side surface completely through said ring-shaped well and into a portion of the semiconductor body of the first conductivity type underneath the ring-shaped well; wherein each deep trench isolation ring includes a buried insulated electrode comprising a conductive material portion that is configured to receive a bias voltage.

In an embodiment, an image sensor cell comprises: a semiconductor body of a first conductivity type delimited by an insulating peripheral wall and doped with a first doping level; at a front side surface of the semiconductor body, a well of a second conductivity type; at the front side surface of the semiconductor body, a region doped with the first conductivity type at a second doping level greater than the first doping level; an insulated vertical gate structure within the semiconductor body and separating said region from the well, wherein a conductive material portion of the insulated vertical gate structure is configured to receive a gate voltage; and a plurality of buried insulated electrodes extending from the front side surface completely through said well and into a portion of the semiconductor body of the first conductivity type underneath the well, wherein a conductive material portion of each buried insulated electrode is configured to receive a bias voltage.

BRIEF DESCRIPTION OF THE DRAWINGS

For a better understanding of the embodiments, reference will now be made by way of example only to the accompanying figures in which.

DETAILED DESCRIPTION

Figure 1:
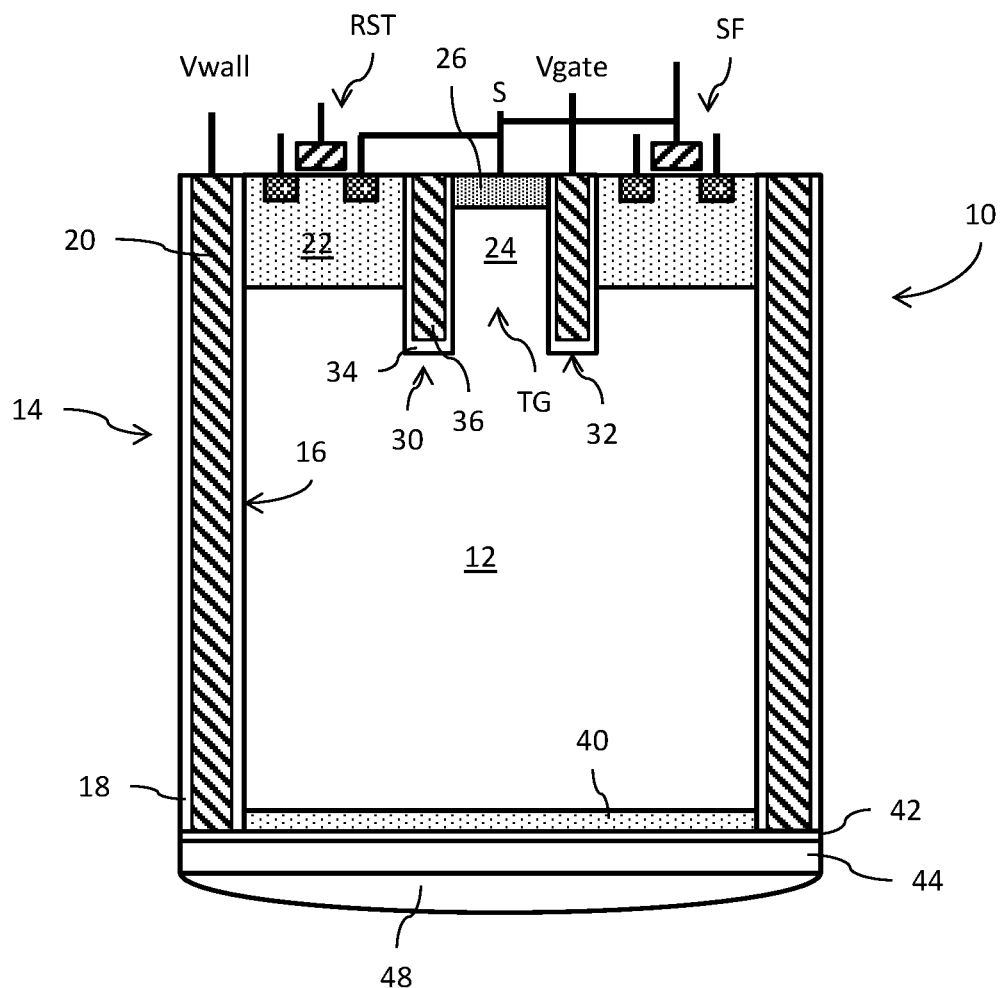
FIG. 1 is a cross-sectional diagram of a pixel cell in accordance with the prior art.

The same elements have been designated with the same reference numerals in the various drawings and, further, the various drawings are not to scale. For clarity, only those elements which are useful to the understanding of the described embodiments have been shown and are detailed. In particular, certain masks used during the steps of the manufacturing method described hereafter have not been shown.

In the following description, terms "high", "side", "lateral", "top", "above", "under", "on", "upper", and "lower" refer to the orientation of the concerned elements in the corresponding drawings.

Figure 2:
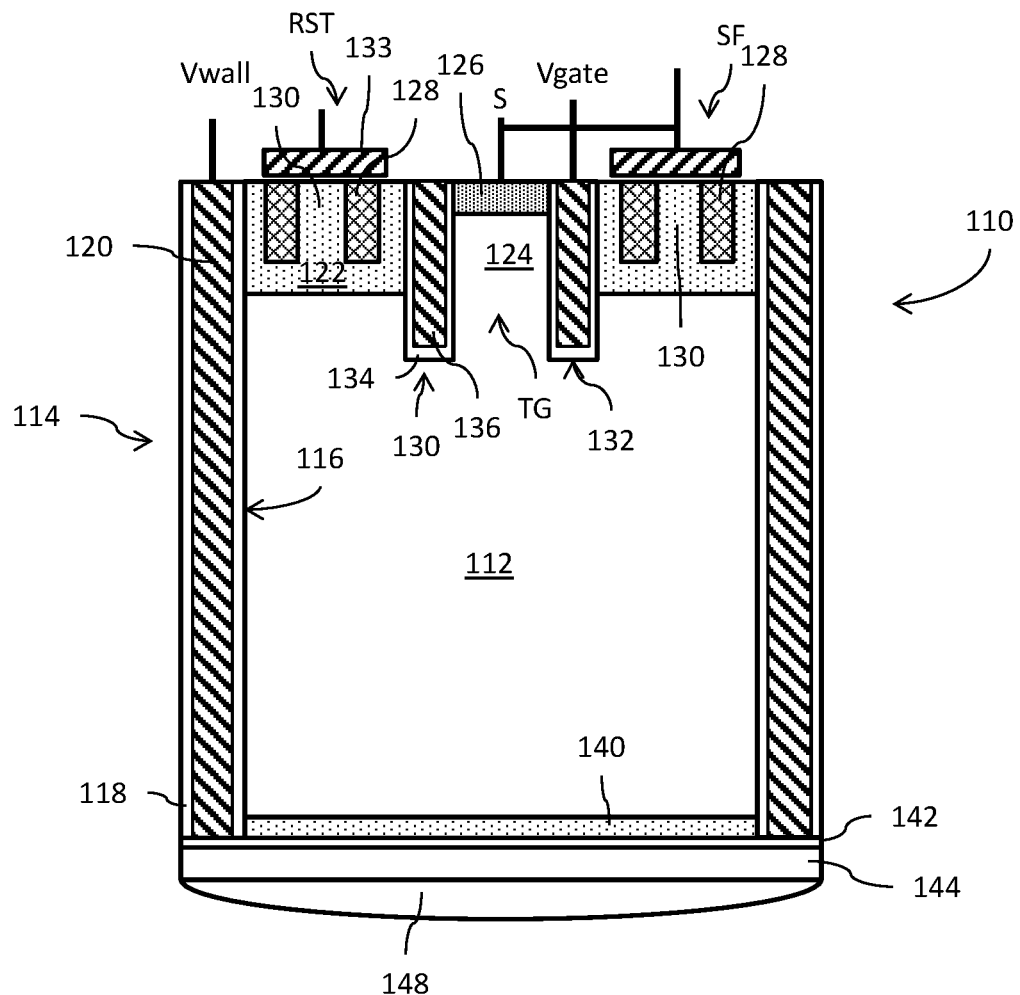
FIG. 2 is a cross-sectional diagram of a pixel cell.

Reference is made to FIG. 2 showing a cross-section view of an embodiment of a cell 110 of an image sensor. This cell 110 is manufactured from a portion of a semiconductor layer (or body) 112 that is lightly-doped with a first conductivity type dopant. The semiconductor material for layer 112 may, for example, comprise silicon. The dopant concentration within layer 112 may, for example, be on the order of from $10^{14}$ to $10^{16}$ atoms/cm$^3$. The layer 112 has a thickness smaller than 20 preferably on the order of from 2 to 6 µm and may, for example, have been formed as the upper silicon layer of a structure of silicon on insulator type (SOI). A wall 114 surrounds the cell 110 and separates the cell 110 from neighboring cells in the image sensor (with a pitch, for example, for adjacent cells of 2 µm). The wall 114 comprises a capacitive deep trench isolation (CDTI) type structure that is formed by a trench 116 having an insulating liner 118 (such as formed by a thermal oxide) and filled with a conductive or semiconductive material (such as a polysilicon material) 120. The trench 116 extends completely through the thickness of the layer 112. The material 120 is electrically connected to be biased with a voltage Vwall. A width of the wall 114 may, for example, be 0.2-0.4 µm. The width of the cell 110 may, for example, be on the order of about 2 µm.

At a front side of the layer 112, a ring shaped well 122 heavily-doped with a second conductivity type dopant extends into the layer 112. The dopant concentration within well 122 may, for example, be on the order of from $1\times10^{16}$ to $1\times10^{18}$ atoms/cm$^3$. A lateral width of ring well may, for example, be 0.5-0.6 µm. The ring shaped well 122 surrounds a central first conductivity type region of the layer 112 at the front side. The central first conductivity type region includes a portion 124 of the lightly-doped layer 112 and a top region 126 heavily-doped with the first conductivity type dopant and extending into the layer 112 on top of and in contact with the portion 124. The dopant concentration within top region 126 may, for example, be on the order of from $1\times10^{19}$ to $5\times10^{20}$ atoms/cm$^3$. A lateral width of the central first conductivity type top region 126 may, for example, be 0.2-0.6 µm.

The central first conductivity type top region 126 is separated from the ring shaped well 122 by a wall 130. A width of the wall 130 may, for example, be 0.1-0.3 µm. The wall 130 comprises a vertical gate (VEGA) electrode type structure that is formed by a trench 132 having an insulating liner 134 (such as formed by a thermal oxide) and filled with a semiconductive material (such as a polysilicon material) 136. The trench 132 extends to a depth that exceeds the thickness of the ring shaped well 122 (but does not extend completely through the layer 112). The material 136 is electrically connected to be biased with a voltage Vgate.

The portion 124, top region 126 and VEGA electrode form a transfer gate transistor (TG) for the cell 110. The ring shaped well 122 supports the formation of a number of other transistors of the planar MOSFET type for the cell 110. These transistors include a reset (precharge) transistor (RST) and a source-follower transistor (SF). A read transistor for the cell 10 is not shown in FIG. 2 but is connected to the circuitry in a manner known to those skilled in the art to support signal read out operations. The connection and operation of the transistors TG, RST and SF are well known to those skilled in the art with respect to the operation of the cell 110.

Within the ring shaped well 122, a plurality of shallow trench isolations 128, each in the shape of a ring structure, surround a corresponding region 130 of the ring shaped well 122. It is within the regions 130 that the source, drain and channel regions of the reset (precharge) transistor and source-follower transistor are formed. These planar MOSFET devices each include an insulated gate 133 for controlling conduction through the channel region between the source and drain regions.

In general, various metallization levels are formed on the front side to ensure the electrical connections to and between the drains, sources, and gates of the various transistors. In particular, an interconnect corresponding to a read node S of the cell is provided between top region 126, the drain of reset transistor RST, and the gate of the source-follower transistor SF is supported by the various metallization levels. The precharge and read transistors may be common to several neighboring cells (for example, shared by a group of four cells).

The cell 110 is a backside illumination (B SI) device. At a back side of the layer 112, a thin layer 140 heavily-doped of the second conductivity type is formed extending into the layer 112 from the rear surface. The dopant concentration within layer 140 may, for example, be on the order of from $1 \times 10^{17}$ to $1 \times 10^{19}$ atoms/cm$^3$. The layer 140 has a function of inversion of the type of majority carriers contained in layer 112. This inversion of the concentration of the type of carriers might also be performed by a MOS capacitance at the rear surface provided with an electrode (metallic, semiconductor, or dielectric), transparent in the useful sensor sensitivity spectrum, which creates a free carrier inversion channel (MOS effect).

The rear surface of each cell is covered with an antireflection coating layer 142 and a filter layer 144 having the desired color for the considered cell, for example, red, green, blue or infra-red. Although this is optional in this type of structure, a lens 148 may cover filter layer 144.

Operation of the cell for light detection is well known in the art. There is a phase of photoconversion or integration during which the rear surface is illuminated and electrons are stored in a charge collection area of layer 112. A transfer phase then occurs during which the electrons are transferred from a charge collection area of layer 112 to the top region 126 working as the read node S. During the integration phase, the conduction between the charge collection area of layer 112 and top region 126 is interrupted by the transfer gate transistor (TG) in response to application of the gate voltage Vgate to the conductor 136 of the vertical gate electrode. When the vertical gate electrode is biased at a low or negative voltage, for example, −1 volt, the portion 124 of the lightly-doped layer 112 is fully depleted from electrons and the passing of the charge carriers is inhibited by the potential barrier (inversion layer) thus created between portion 124 and the charge collection area of layer 112. Thus, the portion 124 plays the role of a controlled channel region and top region 126 corresponds to a drain region of the transfer gate transistor connected to the read node S.

Figure 3:
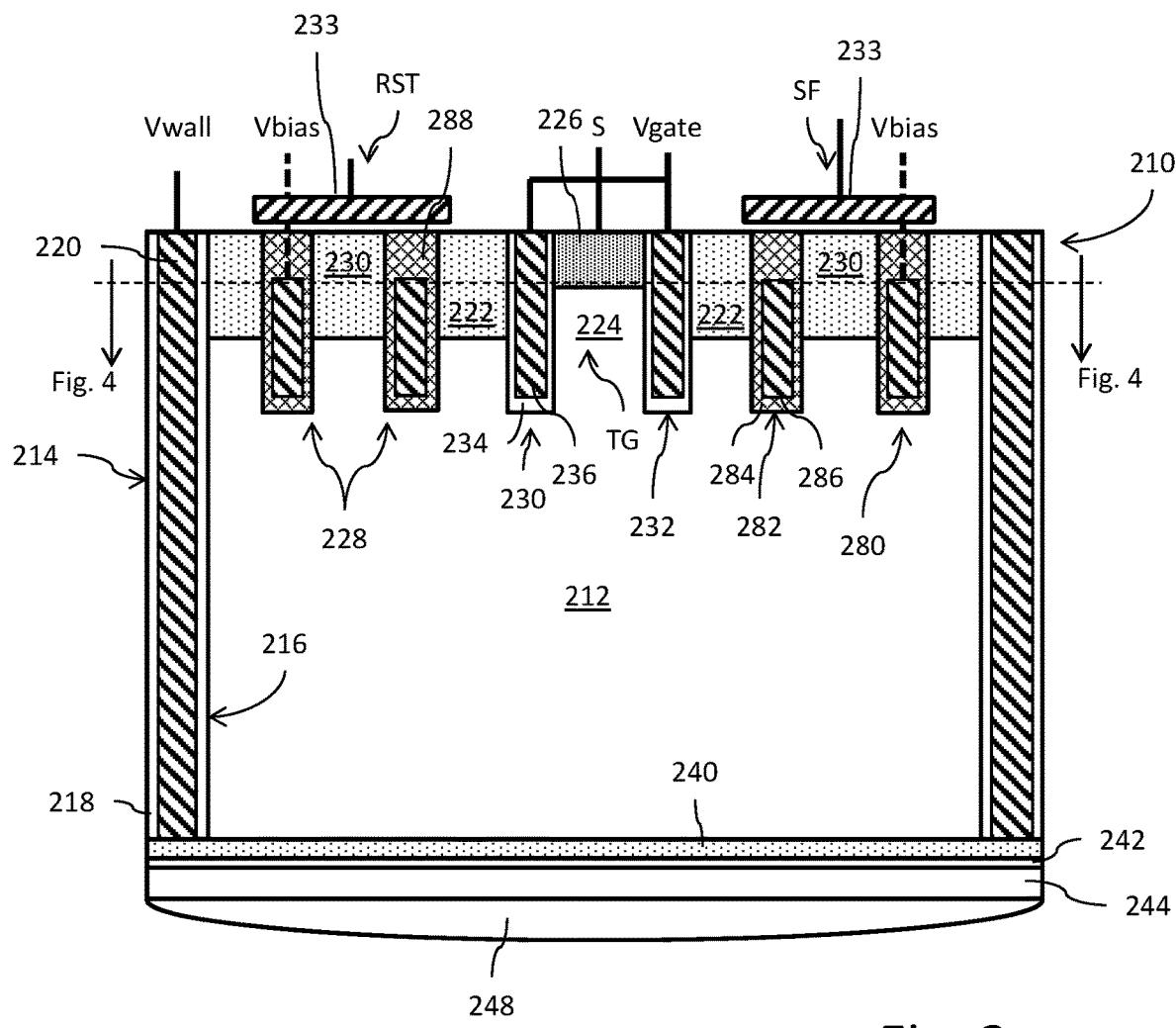
FIG. 3 is a cross-sectional diagram of a pixel cell with enhanced infra-red response and enhanced dark current figure.

Reference is made to FIG. 3 showing a cross-section view of an embodiment of a cell 210 of an image sensor. This cell 210 is manufactured from a portion of a semiconductor layer (or body) 212 that is lightly-doped with a first conductivity type dopant. The semiconductor material for layer 212 may, for example, comprise silicon. The dopant concentration within layer 212 may, for example, be on the order of from $10^{14}$ to $10^{16}$ atoms/cm$^3$. The layer 212 has a thickness smaller than 20 preferably on the order of from 2 to 6 μm and may, for example, have been formed as the upper silicon layer of a structure of silicon on insulator type (SOI). A wall 214 surrounds the cell 210 and separates the cell 210 from neighboring cells in the image sensor (with a pitch, for example, for adjacent cells of 2 μm). The wall 214 comprises a capacitive deep trench isolation (CDTI) type structure that is formed by a trench 216 having an insulating liner 218 (such as formed by a thermal oxide) and filled with a conductive or semiconductive material (such as a polysilicon material) 220.

The trench 216 extends completely through the thickness of the layer 212. The material 220 is electrically connected to be biased with a voltage Vwall. A width of the wall 214 may, for example, be 0.2-0.4 μm. The width of the cell 210 may, for example, be on the order of about 2 μm.

At a front side of the layer 212, a ring shaped well 222 heavily-doped with a second conductivity type dopant extends into the layer 212. The dopant concentration within well 222 may, for example, be on the order of from $1 \times 10^{16}$ to $1 \times 10^{18}$ atoms/cm$^3$. A lateral width of ring well may, for example, be 0.5-0.6 μm. The ring shaped well 222 surrounds a central first conductivity type region of the layer 212 at the front side. The central first conductivity type region includes a portion 224 of the lightly-doped layer 212 and a top region 226 heavily-doped with the first conductivity type dopant and extending into the layer 212 on top of and in contact with the portion 224. The dopant concentration within top region 226 may, for example, be on the order of from $1 \times 10^{19}$ to $5 \times 10^{20}$ atoms/cm$^3$. A lateral width of the central first conductivity type top region 226 may, for example, be 0.2-0.6 μm.

The central first conductivity type top region 226 is separated from the ring shaped well 222 by a wall 230. A width of the wall 230 may, for example, be 0.1-0.3 μm. The wall 230 comprises a vertical gate (VEGA) electrode type structure that is formed by a trench 232 having an insulating liner 234 (such as formed by a thermal oxide) and filled with a semiconductive material (such as a polysilicon material) 236. The trench 232 extends to a depth that exceeds the thickness of the ring shaped well 222 (but does not extend completely through the layer 212). The material 236 is electrically connected to be biased with a voltage Vgate.

The portion 224, top region 226 and VEGA electrode form a transfer gate transistor (TG) for the cell 210. The ring shaped well 222 supports the formation of a number of other transistors of the planar MOSFET type for the cell 210. These transistors include a reset (precharge) transistor (RST) and a source-follower transistor (SF). A read transistor for the cell 210 is not shown in FIG. 3 but is connected to the circuitry in a manner known to those skilled in the art to support signal read out operations. The connection and operation of the transistors TG, RST and SF are well known to those skilled in the art with respect to the operation of the cell 210.

Within the ring shaped well 222, a plurality of deep trench isolations 228, each in the shape of a ring structure, surround a corresponding region 230 of the ring shaped well 222 and extend to a depth that penetrates completely through the well 222 and partially into the layer 212. It is within the regions 230 that the source, drain and channel regions of the reset (precharge) transistor and source-follower transistor are formed. These planar MOSFET devices each include an insulated gate 233 for controlling conduction through the channel region between the source and drain regions. The insulated gate 233 has a lateral extent (in the direction of the gate width) that extends over the deep trench isolations 228.

In general, various metallization levels are formed on the front side to ensure the electrical connections to and between the drains, sources, and gates of the various transistors. In particular, an interconnect corresponding to a read node S of the cell is provided between top region 226, the drain of reset transistor RST, and the gate of the source-follower transistor SF is supported by the various metallization levels. The precharge and read transistors may be common to several neighboring cells (for example, shared by a group of four cells).

The cell 210 is a backside illumination (BSI) device. At a back side of the layer 212, a thin layer 240 heavily-doped of the second conductivity type is formed extending into the layer 212 from the rear surface. The dopant concentration within layer 240 may, for example, be on the order of from $1 \times 10^{17}$ to $1 \times 10^{19}$ atoms/cm$^3$. The layer 240 has a function of inversion of the type of majority carriers contained in layer 212. This inversion of the concentration of the type of carriers might also be performed by a MOS capacitance at the rear surface provided with an electrode (metallic, semiconductor, or dielectric), transparent in the useful sensor sensitivity spectrum, which creates a free carrier inversion channel (MOS effect).

The rear surface of each cell is covered with an antireflection coating layer 242 and a filter layer 244 having the desired color for the considered cell, for example, red, green, blue or infra-red. Although this is optional in this type of structure, a lens 248 may cover filter layer 244.

Operation of the cell for light detection is well known in the art. There is a phase of photoconversion or integration during which the rear surface is illuminated and electrons are stored in a charge collection area of layer 212. A transfer phase then occurs during which the electrons are transferred from a charge collection area of layer 212 to the top region 226 working as the read node S. During the integration phase, the conduction between the charge collection area of layer 212 and top region 226 is interrupted by the transfer gate transistor (TG) in response to application of the gate voltage Vgate to the conductor 136 of the vertical gate electrode. When the vertical gate electrode is biased at a low or negative voltage, for example, −1 volt, the portion 224 of the lightly-doped layer 212 is fully depleted from electrons and the passing of the charge carriers is inhibited by the potential barrier (inversion layer) thus created between portion 224 and the charge collection area of layer 212. Thus, the portion 224 plays the role of a controlled channel region and top region 226 corresponds to a drain region of the transfer gate transistor connected to the read node S.

The cell 210 is particularly provided for the detection of infra-red radiation. To enhance the performance of the cell 210 for infra-red radiation detection, the cell 210 includes a plurality of insulated electrodes 280 that are buried within the deep trench isolations 228. Each insulated electrode 280 is formed by a trench 282 which defines the location of the deep trench isolation 228, wherein the trench 282 has an insulating liner 284 (such as formed by a thermal oxide) and is filled with a semiconductive material (such as a polysilicon material) 286. The trench 282 extends to a depth that exceeds the thickness of the ring shaped well 222 (but does not extend completely through the layer 212). The material 286 is electrically connected to be biased with a voltage Vbias. The trenches 282 are positioned laterally between the trench 216 for the wall 214 and the trench 232 for the VEGA electrode. In an embodiment, the trenches 282 and 232 may have a same depth, but this is not a requirement and certain applications may use trenches of different depths. The voltage Vbias and the voltage Vwall are a same polarity voltage may comprise a same voltage magnitude. A top of the semiconductive material 286 is offset from a top surface of the ring shaped well 222 by insulating dielectric material 288 such that the semiconductive material 286 is buried within the deep trench isolation 228 which surrounds the region 230 of the ring shaped well 222.

The advantage of the provision of both the capacitive deep trench isolation wall 114 and the deep trench isolations 228 with buried electrodes 280 is that the MOSFET transistor will be advantageously integrated on the top surface of the buried electrode and the bottom deep trench zone is used as a structured surface. In this context, the structured surface advantageously enhances the responsiveness of the cell 100 to detect infra-red radiation (i.e., improve infra-red and near infra-red absorption by the cell). The STI structured zone of the prior art suffers from dark current parasitic signal generation, while the MOS trench-based structured surface, biased in inversion mode as provided herein, advantageously drastically reduces or even cancels this STI related structured surface dark signal drawback.

In an example implementation where the first conductivity type is p-type and the second conductivity type is n-type, the voltage Vbias and the voltage Vwall may be +3V. The voltage Vgate is +3V when the transfer gate is turned off and is 0V when the transfer gate is turned on.

Figure 4:
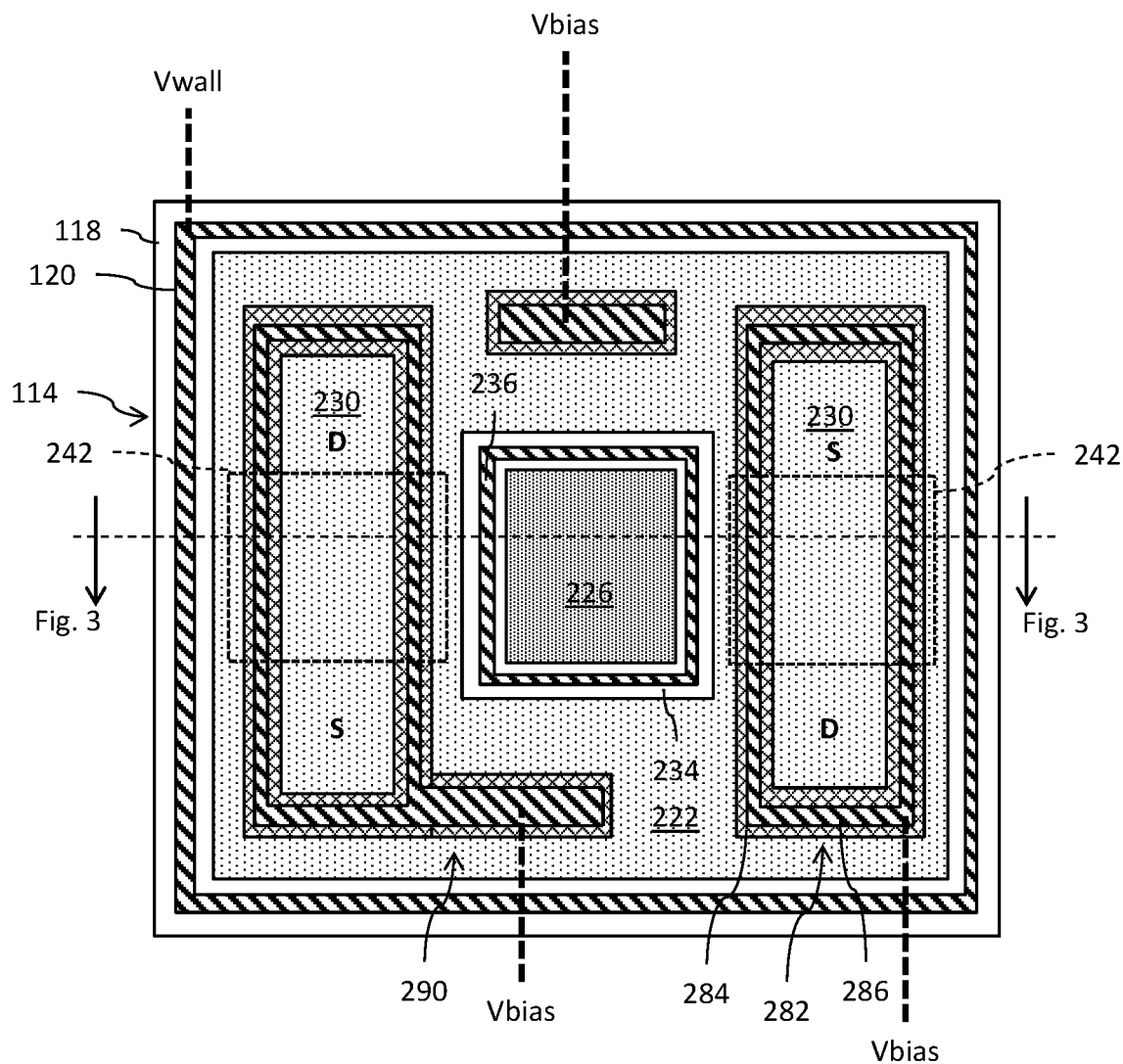
FIG. 4 is a plan view of the cell of FIG. 6.

FIG. 4 shows a cross-sectional plan view of the cell 210. The cross-sectional plan view illustrates an example of the positional relationships of the doped source/drain regions (S/D) for the transistors supported by the ring shaped well 222 within the regions 230, the insulated electrodes 280 extending through the well 222 relative to the peripheral wall 214 and the VEGA electrode (transfer gate transistor) for the cell 210. The cross-sectional plan view further illustrates an example of the shape and configuration of the insulated electrodes 280. It will be noted that the insulated electrodes 280 may extend, as generally indicated at reference 290, away from the ring shaped portions so as to support making of the Vbias electrical contact.

Alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An image sensor cell, comprising:
   a semiconductor body of a first conductivity type delimited by an insulating peripheral wall and doped with a first doping level;
   at a front side surface of the semiconductor body, a ring-shaped well of a second conductivity type;
   at the front side surface of the semiconductor body, a region doped with the first conductivity type at a second doping level greater than the first doping level, said region surrounded by the ring-shaped well;
   an insulated vertical gate structure within the semiconductor body and separating said region from the ring-shaped well, wherein a conductive material portion of the insulated vertical gate structure is configured to receive a gate voltage; and
   a plurality of deep trench isolation rings extending from the front side surface completely through said ring-shaped well and into a portion of the semiconductor body of the first conductivity type underneath the ring-shaped well;
   wherein each deep trench isolation ring includes a buried insulated electrode comprising a conductive material portion that is configured to receive a bias voltage.

2. The image sensor cell of claim 1, wherein the insulating peripheral wall is a capacitive deep trench isolation structure and wherein a conductive material portion of the capacitive deep trench isolation structure is configured to receive a wall voltage.

3. The image sensor cell of claim 2, wherein the bias voltage and wall voltage have a same polarity.

4. The image sensor cell of claim 3, wherein the bias voltage and wall voltage have a same magnitude.

5. The image sensor cell of claim 1, wherein the first conductivity type is n-type and the second conductivity type is p-type.

6. The image sensor cell of claim 1, wherein the first conductivity type is p-type and the second conductivity type is n-type.

7. The image sensor cell of claim 1, wherein the buried insulated electrodes are positioned between the insulated vertical gate structure and the insulating peripheral wall.

8. The image sensor cell of claim 1, wherein each deep trench isolation ring delimits a region of the ring-shaped well within which source, channel and drain regions of a MOSFET transistor are provided, the MOSFET transistor further including an insulated gate that laterally extends over the channel and is insulated from the deep trench isolation ring.

9. The image sensor cell of claim 8, wherein the MOSFET transistor is a reset transistor.

10. The image sensor cell of claim 8, wherein the MOSFET transistor is a source follower transistor.

11. The image sensor cell of claim 1, further including a doped region of the second conductivity type at the back side surface of the semiconductor body, wherein said back side surface is configured to receive infra-red radiation.

12. The image sensor cell of claim 11, further including an infra-red filter at the back side surface.

13. The image sensor cell of claim 1, wherein a top of the buried insulated electrode is vertically offset from a top of the ring-shaped well by insulating dielectric material.

14. The image sensor cell of claim 1, further comprising an extension of the buried insulated electrode beyond the deep trench isolation ring for making electrical contact to the bias voltage.

15. An image sensor cell, comprising:
a semiconductor body of a first conductivity type delimited by an insulating peripheral wall and doped with a first doping level;
at a front side surface of the semiconductor body, a well of a second conductivity type;
at the front side surface of the semiconductor body, a region doped with the first conductivity type at a second doping level greater than the first doping level;
an insulated vertical gate structure within the semiconductor body and separating said region from the well, wherein a conductive material portion of the insulated vertical gate structure is configured to receive a gate voltage; and
a plurality of buried insulated electrodes extending from the front side surface completely through said well and into a portion of the semiconductor body of the first conductivity type underneath the well, wherein a conductive material portion of each buried insulated electrode is configured to receive a bias voltage.

16. The image sensor cell of claim 15, wherein the insulating peripheral wall is a capacitive deep trench isolation structure and wherein a conductive material portion of the capacitive deep trench isolation structure is configured to receive a wall voltage.

17. The image sensor cell of claim 16, wherein the bias voltage and wall voltage have a same polarity.

18. The image sensor cell of claim 16, wherein the bias voltage and wall voltage have a same magnitude.

19. The image sensor cell of claim 15, wherein the first conductivity type is n-type and the second conductivity type is p-type.

20. The image sensor cell of claim 15, wherein the first conductivity type is p-type and the second conductivity type is n-type.

21. The image sensor cell of claim 15, wherein the plurality of buried insulated electrodes are positioned between the insulated vertical gate structure and the insulating peripheral wall.

22. The image sensor cell of claim 15, wherein each buried insulated electrode surrounds and is insulated from a region of the well that includes source, channel and drain regions of a MOSFET transistor, the MOSFET transistor further including an insulated gate that laterally extends over the channel and is insulated from the buried insulated electrode.

23. The image sensor cell of claim 22, wherein the MOSFET transistor is a reset transistor.

24. The image sensor cell of claim 22, wherein the MOSFET transistor is a source follower transistor.

25. The image sensor cell of claim 15, further including:
a doped region of the second conductivity type at the back side surface of the semiconductor body, wherein said back side surface is configured to receive infra-red radiation; and
an infra-red filter at the back side surface.

26. The image sensor cell of claim 15, wherein a top of the conductive material portion of each buried insulated electrode is vertically offset from a top of the well by insulating dielectric material.

27. The image sensor cell of claim 15, further comprising an extension of the buried insulated electrode parallel to the front side surface for making electrical contact to the bias voltage.

* * * * *